United States Patent
Kanayama et al.

(10) Patent No.: US 7,138,688 B2
(45) Date of Patent: Nov. 21, 2006

(54) DOPING METHOD AND SEMICONDUCTOR DEVICE FABRICATED USING THE METHOD

(75) Inventors: Toshihiko Kanayama, Tsukuba (JP); Takehide Miyazaki, Tsukuba (JP); Hidefumi Hiura, Tokyo (JP)

(73) Assignees: National Institute of Advanced Industrial Science and Technology, Tokyo (JP); NEC Corporation, Tokyo (JP)

( * ) Notice: Subject to any disclaimer, the term of this patent is extended or adjusted under 35 U.S.C. 154(b) by 70 days.

(21) Appl. No.: 10/655,041

(22) Filed: Sep. 5, 2003

(65) Prior Publication Data

US 2004/0121567 A1 Jun. 24, 2004

(30) Foreign Application Priority Data

Sep. 6, 2002 (JP) .............................. 2002-261239

(51) Int. Cl.
*H01L 29/76* (2006.01)

(52) U.S. Cl. ..................................... 257/382; 257/383
(58) Field of Classification Search ........ 257/382–383, 257/768
See application file for complete search history.

(56) References Cited

U.S. PATENT DOCUMENTS

| | | | | |
|---|---|---|---|---|
| 3,987,480 A | * | 10/1976 | Diguet et al. ................ | 257/771 |
| 4,462,149 A | * | 7/1984 | Schwabe ..................... | 438/621 |
| 4,502,205 A | * | 3/1985 | Yahano ....................... | 438/307 |
| 4,765,845 A | * | 8/1988 | Takada et al. ............... | 136/258 |
| 5,053,917 A | * | 10/1991 | Miyasaka et al. ........... | 361/321.5 |
| 5,108,940 A | * | 4/1992 | Williams .................... | 438/288 |

FOREIGN PATENT DOCUMENTS

| | | |
|---|---|---|
| JP | 8-167658 | 6/1996 |
| JP | 9-61597 | 3/1997 |
| JP | 2000-327319 | 11/2000 |
| WO | WO 99/49521 | 9/1999 |

OTHER PUBLICATIONS

B. Mizuno, Plasma Doping, vol. 70, No. 12, pp. 1458-1462, "Plasma, Ion, Implantation, Doping, Semiconductor, Surface, Modification, LSI", 2001 (with English Abstract), no month cited in document.
K. Mutoh, Electronic Materials, pp. 94-99, "VLSI Manufacturing and Testing Apparatus Guidebook", 2001 (with English Abstract), no month cited in document.
K. Shibahara, et al., International Conference on Solid State Devices and Materials, pp. 236-237, "Antimony Behavior in Laser Annealing Process for Ultra Shallow Junction Formation", 2001, no month cited in document.
A. Ono, et al., Symposium on VLSI Technology Digest of Technical Papers, pp. 14-15, "A 70 NM Gate Length CMOS Technology with 1.0 V Operation", 2000, no month cited in document.

(Continued)

*Primary Examiner*—N. Drew Richards
(74) *Attorney, Agent, or Firm*—Oblon, Spivak, McClelland, Maier & Neustadt, P.C.

(57) ABSTRACT

A doping method includes the step of attaching molecules or clusters to the surface of a semiconductor substrate to enable charge transfer from the molecules or clusters to the substrate surface, thereby inducing carriers underneath the substrate surface. A semiconductor device is fabricated through attachment of molecules or clusters to the surface of a semiconductor substrate. The attachment enables charge transfer from the molecules or clusters to the substrate surface to induce carriers underneath the substrate surface.

6 Claims, 3 Drawing Sheets

OTHER PUBLICATIONS

Matthias Krack, et al., "Doping of saturated silicon clusters", Chemical Physics Letters, vol. 237, No. 3-4, XP-002381019, May 1995, pp. 250-255.

Karl Jug, et al., "Doping of silicon clusters", Chemical Physics Letters, vol. 184, No. 1,2,3, XP-002381020, Sep. 1991, pp. 209-214.

M. O. Watanabe, et al., "Deposition of Hydrogenated Si Clusters on Si(111)-(7×7) Surfaces", Physical Review Letters, vol. 81, No. 24, XP-002381021, Dec. 1998, pp. 5362-5365.

P. M. Voyles, et al., "Atomic-scale imaging of individual dopant atoms and clusters in highly n-type bulk Si", Letters to nature, vol. 416, XP-002381022, Apr. 2002, pp. 826-829.

* cited by examiner

DOPING METHOD AND SEMICONDUCTOR DEVICE FABRICATED USING THE METHOD

BACKGROUND OF THE INVENTION

1. Field of the Invention

The present invention relates to, of a semiconductor device fabrication process, a doping method for p-n junction formation and to a semiconductor device fabricated using the method. More particularly, the invention relates to a high-concentration doping method having an extremely shallow junction depth and to a metal-oxide-semiconductor field effect transistor (hereinafter referred to simply as MOSFET) fabricated using the method.

2. Description of the Prior Art

In the case of semiconductor large-scale-integrated circuit (LSI) devices with miniaturization of constituent elements, a high-integration level and a high-speed property have been achieved simultaneously. Also in the case of MOSFETs, improvements in the technique of reducing the size thereof have been made. With the reduction in channel length, however, the short-channel effect and a so-called hot-carrier phenomenon that is a phenomenon undesirable for the performance of transistors have been brought about conspicuously.

In order to suppress occurrence of the phenomena adversely affecting the performance of the semiconductor devices, it is required to shallow the depth of the source-drain junction. In addition, it is required to make the resistivity of the doping layers (sheet resistance) in the source and drain as low as possible in order to enhance the ability to current-drive the transistors. In view of these, in ultra-small MOSFETs, the carrier concentration of the doping layer must be high to satisfy these requirements. That is to say, ultra-small MOSFETs are required to achieve the shallow source-drain junction and low sheet resistance at the same time.

The conventional techniques of forming a shallow source-drain junction include a Combination of Low-energy Ion Implantation and Rapid Thermal Annealing Process (A. Ono et al.: 2000 symposium on VLSI Technology Digest of Technical Papers, p. 14), Plasma Doping (B. Mizuno: Oyo Butsuri (in Japanese), Vol. 70, 12, pp. 1458–1462, 2001), Elevated Source/Drain by Selective Epitaxial Growth (K. Muto: Electronic Material, Nov. Independent Vol./2002 VLSI Manufacturing and Testing Apparatus Guidebook, pp. 94–99, 2001) Solid Phase Diffusion (E. Murakami et al.: JP-A HEI 8-16765 8) and Laser Doping (K. Shibahara et al.: 2001 Solid State Devices and Materials, p. 236).

However, the junction depth and sheet resistance obtained by the conventional techniques are 20 nm at most and around 400 Ω/square, respectively. In order to achieve the fabrication of further small transistors, there is a need to develop a technique of forming a shallower source-drain junction and a doping layer having a higher carrier density over the conventional techniques.

In addition, great electric power is required to perform the conventional processes mentioned above, particularly the rapid thermal annealing process. This poses a problem from the standpoint of energy efficiency. The high temperature required in the conventional processes also makes it unable to use new materials having low heat resistance, such as high dielectric constant gate insulator materials and metal gate materials.

Furthermore, since any of the aforementioned conventional techniques introduces impurity atoms into a semiconductor through a stochastic process, such as ion implantation or thermal diffusion, it is unavoidable as an inevitable consequence to statistically vary the positions and concentrations of the impurity atoms. The variation causes variations in characteristics of the semiconductor devices fabricated. This is a serious problem in addition to the problem of requiring the semiconductor devices to be made minute. However, since no doping method capable of solving these problems has yet been known to the art, and there is an increasing demand for establishing a novel doping method The present invention has been proposed in view of the above, and its object is to provide a doping method that can realize a shallow source-drain junction and low sheet resistance, improve the energy efficiency in fabricating semiconductor devices and be applied also to materials having restrictions on heat resistance without varying the characteristics of the semiconductor devices, and to provide a semiconductor device fabricated using the doping method.

SUMMARY OF THE INVENTION

The doping method of the present invention comprises attaching molecules or clusters (atomic groups) to a surface of a semiconductor substrate to enable charge transfer from the molecules or clusters to the substrate surface, thereby inducing carriers underneath the substrate surface.

The semiconductor device of the present invention is fabricated through attachment of molecules or clusters (atomic groups) to a surface of a semiconductor substrate that enables charge transfer from the molecules or clusters to the substrate surface to induce carriers underneath the substrate surface.

As described above, the present invention only adopts the step of attaching molecules or clusters to a semiconductor substrate surface to realize doping and does not require a high-temperature activation treatment. This enables use of materials having restrictions on heat resistance and reduces power consumption required in fabricating a semiconductor device.

Furthermore, since the thickness of the molecules or clusters attached to the substrate surface is in the order of sub-nanometers, a shallow source-drain junction and a low sheet resistance can be realized. Moreover, in the present doping method, since the molecules or clusters are attached to the substrate surface at a high density, variations in characteristics of semiconductor devices can be suppressed.

The above and other objects, characteristic features and advantages of the present invention will become apparent from the description made herein below with reference to the accompanying drawings.

DESCRIPTION OF THE PREFERRED EMBODIMENT

FIG. 1 is an explanatory view illustrating the principle of the present invention. In the present invention, molecules or clusters serving as carrier supply sources are attached to the surface of a semiconductor substrate to enable charge transfer from the molecules or clusters to the substrate surface, thereby forming an extremely thin, high-concentration, carrier conduction layer just underneath the substrate surface.

Figure 1A:
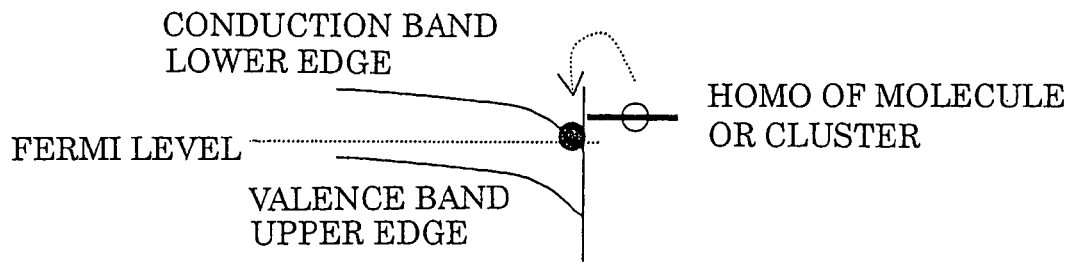
FIG. 1 is an explanatory view illustrating the principle of the present invention, FIG. 1(a) showing the case where the energy level of the highest occupied molecular orbital of the molecules or clusters attached to the substrate surface is higher than the lower edge of the conduction band of the substrate surface, and FIG. 1(b) showing the case where the energy level of the lowest unoccupied molecular orbital of the molecules or clusters attached to the substrate surface is lower than the upper edge of the valence band of the substrate surface.

In the high-concentration carrier conduction layer, the type of carriers is determined by the difference in chemical potential between the substrate surface and the molecules or clusters serving as carrier-supplying sources. In the case where the energy level of the highest occupied molecular orbital (HOMO) of the molecules or clusters attached as the carrier-supplying sources to the substrate surface is higher than the lower edge of the conduction band of the substrate surface, as shown in FIG. 1(a), charge transfer is caused to induce negative charge from the molecules or clusters into the substrate surface, thereby inducing positive charge on the molecules or clusters, attracting electrons to the substrate surface, and forming a carrier conduction layer just under the surface. In this case, conduction electrons carry the electric current in the carrier conduction layer.

Figure 1B:
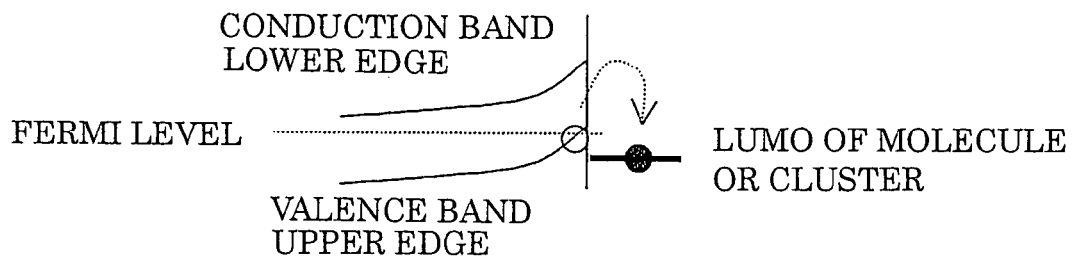

Inversely, in the case where the energy level of the lowest unoccupied molecular orbital (LUMO) of the molecules or clusters attached to the substrate surface is lower than the upper edge of the valence band of the substrate surface, as shown in FIG. 1(b), charge transfer is caused to induce negative charge from the substrate surface on the molecules or clusters, thereby inducing negative charge on the molecules or clusters, attracting holes to the substrate surface, and forming a carrier conduction layer. In this case, holes carry the electric current in the carrier conduction layer. When a p-type semiconductor is used as the substrate in the former case, a p-n junction is formed between the p-type semiconductor and the carrier conduction layer. When an n-type semiconductor is used as the substrate in the latter case, a p-n junction is formed between the n-type semiconductor and the carrier conduction layer.

Any kind of molecules or clusters serving as carrier supply sources can be used insofar as the molecular orbital thereof satisfies the aforementioned energy conditions relative to the valence band or conduction band of a semiconductor. Particularly when a semiconductor is formed of silicon, silicon clusters containing transition metal atoms, or Group V atoms, such as arsenic or antimony atoms, or Group III atoms, such as boron or gallium atoms, can be utilized.

Of the silicon clusters, $TaSi_{12}$ containing one tantalum atom and twelve silicon atoms is rich in electron acceptability and has great ability to be negatively charged. Therefore, it can function as an acceptor. On the other hand, a silicon cluster containing a rhenium atom ($ReSi_{16}$) has considerable ability to supply electrons and can therefore function as a donor. Similarly, silicon clusters containing a Group V atom, such as an arsenic or antimony atom, function as donors, and silicon clusters containing a Group III atom, such as a boron or gallium atom, function as acceptors.

The thickness of the carrier supply sources (molecules or clusters attached to the substrate surface) is in the order of sub-nm because it is on a level with the molecules or clusters, and the depth of a formed p-n junction is extremely shallow, i.e. in the order of nm, similarly to the thickness of an inversion layer.

Since the present invention can realize doping only through attachment of molecules or clusters to a semiconductor substrate surface and requires no high-temperature activation treatment, materials having restrictions on heat resistance, such as high dielectric constant gate insulator materials and gate metal materials, can be used without posing any problem. In addition, the power consumption required for the fabrication of a semiconductor device can be reduced.

In a junction formed according to an ordinary doping method conventionally adopted, since a carrier supply source exists in a carrier conduction layer, carriers are scattered by dopant atoms and lattice defects formed when doping to make the carrier mobility low and the carrier conduction sheet resistance high. On the other hand, in the present invention, since the carrier supply source separates from the carrier conduction layer, the amount of carrier scattering by the dopant atoms is essentially small. In addition, by lowering the kinetic energy of depositing molecules or clusters on a semiconductor substrate surface, no lattice defect is induced, and thus the substrate surface is kept physically undamaged. Therefore, the carrier mobility is not lowered by the doping process, and the sheet resistance is of a value expected for an ideal semiconductor substrate surface. That is to say, according to the present invention, a junction having extremely low sheet resistance can be formed While impurity atoms are introduced at random in a semiconductor in the conventional methods, the method of the present invention has molecules or clusters that function as carrier supply sources attached highly densely to a semiconductor substrate surface, resulting in doping with extremely small statistic variation in the positions and concentrations of the impurity atoms.

The molecules or clusters that function as carrier supply sources are not necessarily attached directly to a semiconductor substrate surface. Even when these are attached to the substrate surface via a suitable thin insulator film, the same effects can be obtained, with the aforementioned principle being not modified. The interposition of the thin insulator film enables the surface states of the substrate surface to be extinguished and the charge transfer efficiency to be enhanced. When a semiconductor is formed of silicon, the insulator film usable is a thermally oxidized film, for example.

An experiment was conducted to prove the principle of the present invention that charge transfer induces carriers.

Clusters for inducing carriers were deposited on a silicon semiconductor having four electrodes formed thereon through the micro-fabrication technique and then a four-terminal electrical measurement was made. In a first embodiment of the invention, the clusters used for inducing carriers were $TaSi_{12}$ clusters (as disclosed in JP-A 2000-327319), one kind of silicon clusters containing a metal atom. The silicon clusters of $TaSi_{12}$ were synthesized using an ion trap device (as disclosed in JP-A HEI 9-61597). The synthesized silicon clusters of $TaSi_{12}$ were transported using an ion guide from the ion trap device into a vacuum chamber for the four-terminal electrical measurement in which an n-type silicon substrate having resistivity of 10 Ω·cm was housed, and deposited on the substrate at low energy of 2 eV in a dosage of $2.5 \times 10^{14}$ cm$^{-2}$. The silicon surface on which the silicon clusters of $TaSi_{12}$ had been deposited was observed through a scanning tunnel microscope (STM). The Hall measurement was also made for the mobility measurement. All measurements were made at room temperature in an ultrahigh vacuum ($1 \times 10^{-7}$ Pa).

The STM observation revealed that almost one layer of silicon clusters was deposited on the silicon substrate surface and that the coverage was about 90%. As a consequence of the four-terminal measurement, it was found that the sheet resistance was about 800 Ω/square. In addition, it was found from the positive Hall coefficient that the holes carried the electric current and that the hole mobility was 30 cm$^2$/V·s. It was found therefore that charge transfer from the $TaSi_{12}$ clusters to the silicon substrate was caused at an efficiency of substantially 100%. Thus, the principle of the present invention was proved.

In a second embodiment of the invention, hydrogenated silicon cluster ions containing an arsenic atom, $AsSi_5H_x^+$ wherein x is in the range of from 2 to 6, were deposited in a dosage of $5 \times 10^{14}$ cm$^{-2}$ on a p-type silicon substrate surface having four electrodes formed thereon by the micro-fabrication technique (resistivity: 10 Ω·cm). The coverage was about 60%. In the second embodiment, it was found from the four-terminal measurement that the sheet resistance of the carrier conduction layer induced on the substrate surface was about 500 Ω/square and that the electron mobility was 50 cm$^2$/V·s.

Figure 2:
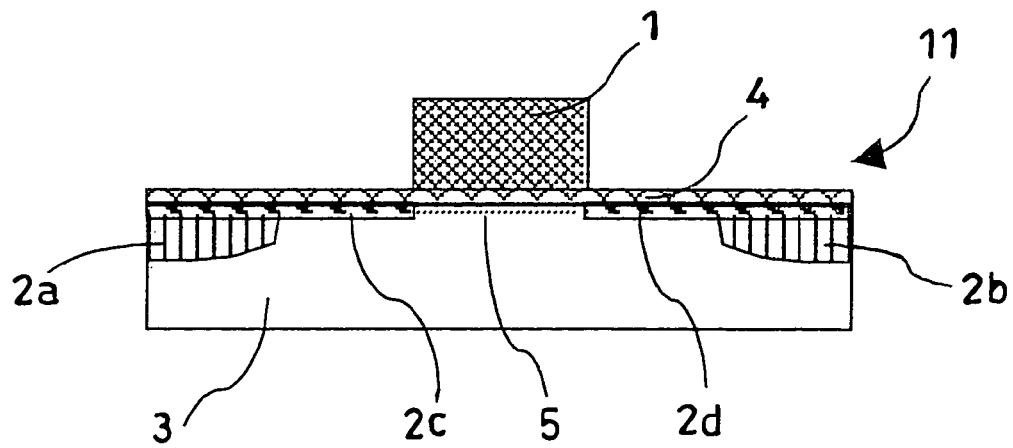
FIG. 2 is a schematic view illustrating the configuration of the MOSFET fabricated according to the third embodiment of the present invention.
Figure 3A:
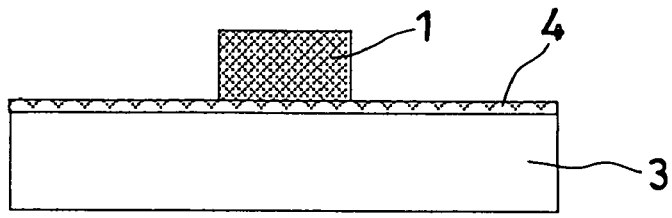
FIG. 3 is a schematic view illustrating the steps of fabricating the MOSFET shown in FIG. 2, FIG. 3(a) showing the step of forming a gate insulator film on a substrate and forming a gate electrode on the gate insulator film, FIG. 3(b) showing the step of implanting boron ions into the substrate and subjecting the ion-implanted substrate to activation treatment to form a source and a drain, FIG. 3(c) showing the step of depositing silicon clusters on the gate electrode and gate insulator film to form a source extension and a drain extension, FIG. 3(d) showing the step of depositing a silicon nitride protective film on the silicon clusters and FIG. 3(e) showing the step of forming windows in the protective film and depositing electrodes on the protective film to fill the windows therewith.
Figure 3B:
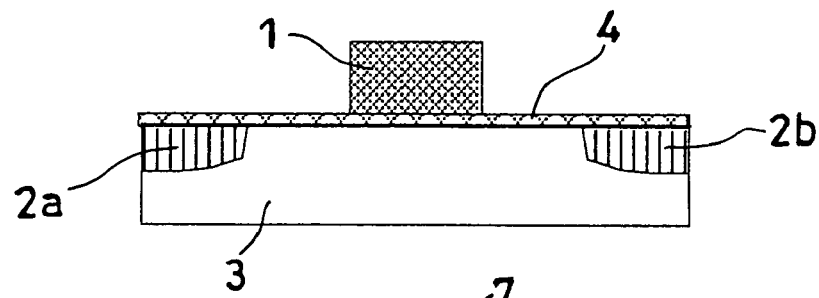
Figure 3C:
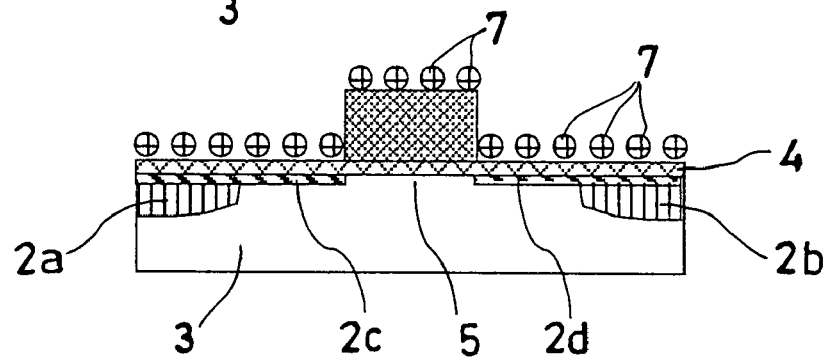
Figure 3D:
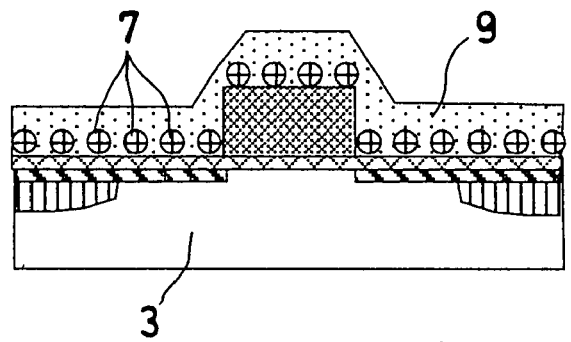
Figure 3E:
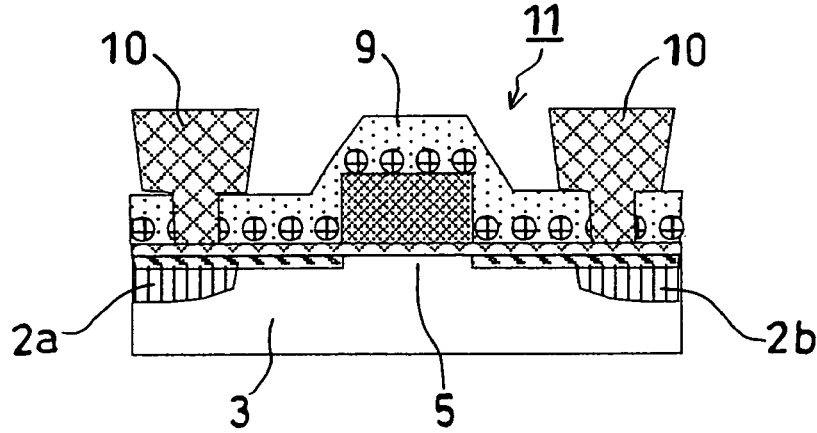

A third embodiment of the invention will be described with reference to FIGS. 2 to 3. In the third embodiment, a MOSFET 11 as schematically shown in FIG. 2 was fabricated through the steps of FIG. 3. First, an oxidized film having a thickness of 5 nm was formed as a gate insulator film 4 by thermal oxidation in dry oxygen on the surface of a silicon substrate 3. A polycrystalline silicon was deposited on the gate insulator film and processed by photolithography into a gate electrode 1 having a length of 1 μm (FIG. 3(a)). An ordinary ion implantation method was used to implant boron ions at energy of 50 keV in a dosage of $1 \times 10^{14}$/cm$^2$ in the silicon substrate 3, and the resultant substrate was subjected to activation treatment at 900° C. in an ordinary heat treatment furnace to form a source 2a and a drain 2b (FIG. 3(b)). The distance between the gate electrode 1 and the source 2a and that between the gate electrode 1 and the drain were both 1 μm. $TaSi_{12}$ clusters were deposited as silicon clusters 7 in a dosage of $1 \times 10^{14}$/cm$^2$ on the entire surface of the structure (gate electrode 1 and gate insulator film 4) to form a source extension region 2c and a drain extension region 2d across a channel 5 (FIG. 3(c)). Then, for stabilization, a silicon nitride film 9 was deposited on the entire surface to bury the silicon clusters 7 therein FIG. 3(d)). Thereafter, the photolithography was again utilized to form windows in the silicon nitride film 9, and aluminum electrodes 10 were then deposited on the silicon nitride film 9 to fill the windows therewith, thereby completing the fabrication of a MOSFET 11 (FIG. 3(e)).

Figure 4A:
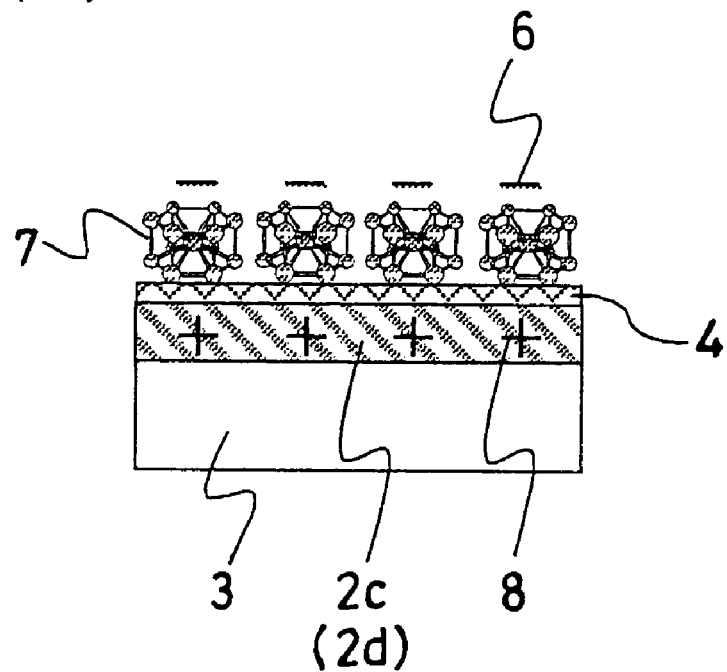
FIG. 4(a) is an enlarged view showing the neighborhood of the source or drain extension region of the MOSFET shown in FIG. 3.

FIG. 4(a) is an enlarged view showing the neighborhood of the source or drain extension region 2c or 2d of the MOSFET 11 of FIG. 3 and illustrating how electric charge transfers from the silicon clusters of $TaSi_{12}$ (silicon clusters 7 utilized to induce carriers) to the surface of the silicon substrate 3. In the MOSFET 11 shown in FIG. 4(a), the silicon clusters were brought into contact with the thermally oxidized film 4 formed on the silicon substrate 3 to receive electrons and readily charged with negative charge 6, and the source and drain extension regions were simultaneously charged with positive charge 8. That is to say, the charge transfer from the clusters attached to the substrate surface to the substrate surface enabled carriers to be induced. Since the thickness of the carrier supply sources (silicon clusters 7 attached to the substrate surface) is on a level with the size of the clusters, the extremely shallow junction with low sheet resistance could be formed, and the MOSFET 11 thus fabricated exhibited good characteristics.

Figure 4B:
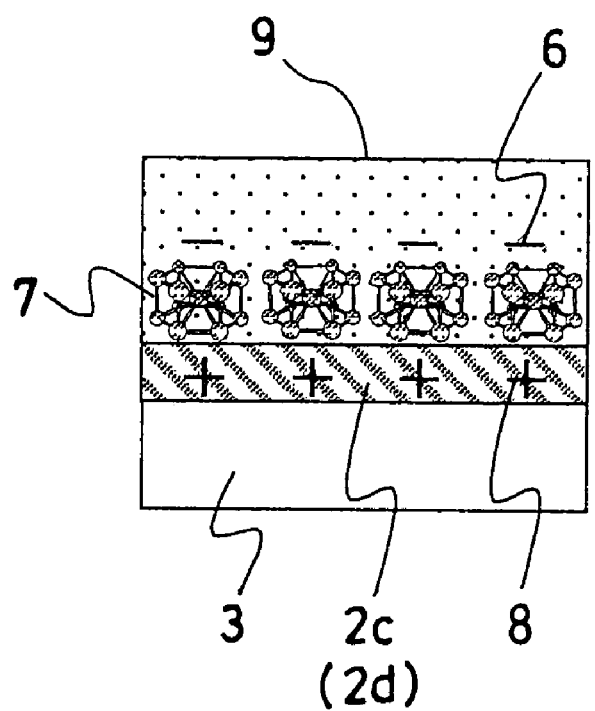
FIG. 4(b) is an enlarged view showing another example of the neighborhood of the source or drain extension region of the MOSFET shown in FIG. 4(a).

While the molecules or clusters were deposited on the substrate surface via the thin insulator film in the example of FIG. 4(a), as shown in FIG. 4(b), the molecules or clusters 7 could be deposited directly on the substrate surface 3, followed by depositing an insulator film 9 as a protective film.

According to the present invention, it is made possible to attain a junction depth of 10 nm and sheet resistance of 830 Ω/square that would be demanded for a source-drain extension junction of MOSGETs having a gate length of 18 nm that would be expected to realize mass-fabrication thereof around 2010. Thus, the present invention has considerable effects of achieving shallow source-drain junction and low sheet resistance.

What is claimed is:

1. A semiconductor device comprising molecules or clusters that are composed of a specific set of atoms and attached to a surface of a semiconductor substrate, and are configured to cause electron withdrawing from the semiconductor substrate or electron donating to the semiconductor substrate, thereby staying on the surface in negatively or positively charged states, to generate charge carriers underneath the substrate surface,
    wherein the clusters comprise silicon clusters including at least one atom other than a silicon atom, and
    wherein the at least one atom other than a silicon atom comprises a transition metal atom.

2. The semiconductor device according to claim 1, wherein the transition metal atom comprises a tantalum atom.

3. The semiconductor device according to claim 1, wherein the transition metal atom comprises a rhenium atom.

4. A semiconductor device comprising molecules or clusters that are composed of a specific set of atoms and attached to a surface of a semiconductor substrate, and are configured to cause electron withdrawing from the semiconductor substrate or electron donating to the semiconductor substrate, thereby staying on the surface in negatively or positively charged states, to generate charge carriers underneath the substrate surface,
    wherein the clusters comprise silicon clusters including at least one atom other than a silicon atom, and
    wherein the silicon clusters include 12 silicon atoms.

5. A semiconductor device comprising molecules or clusters that are composed of a specific set of atoms and attached to a surface of a semiconductor substrate, and are configured to cause electron withdrawing from the semiconductor substrate or electron donating to the semiconductor substrate, thereby staying on the surface in negatively or positively charged states, to generate charge carriers underneath the substrate surface, wherein the clusters comprise silicon clusters including at least one atom other than a silicon atom, and wherein the silicon clusters include 16 silicon atoms.

6. A semiconductor device comprising molecules or clusters that are composed of a specific set of atoms and attached to a surface of the semiconductor substrate, and are configured to cause electron withdrawing from the semiconductor substrate or electron donating to the semiconductor substrate, thereby staying on the surface in negatively or positively charged states, to generate charge carriers underneath the substrate surface, wherein the clusters comprise silicon clusters including at least one atom other than a silicon atom, and wherein the at least one atom other than a silicon atom comprises an arsenic atom, or a Group V atom that includes an antimony atom, or a Group III atom that includes a boron atom and a gallium atom.

* * * * *